United States Patent [19]

Yoshida et al.

[11] 4,115,740
[45] Sep. 19, 1978

[54] PUSH-PULL PULSE AMPLIFIER HAVING IMPROVED TURN-ON AND TURN-OFF TIMES

[75] Inventors: Tadao Yoshida; Tadao Suzuki, both of Tokyo, Japan

[73] Assignee: Sony Corporation, Tokyo, Japan

[21] Appl. No.: 850,830

[22] Filed: Nov. 11, 1977

[30] Foreign Application Priority Data

Nov. 18, 1976 [JP] Japan .............................. 51/138819

[51] Int. Cl.$^2$ .......................... H03F 3/16; H03F 3/26; H03K 17/60
[52] U.S. Cl. .................................... 330/264; 307/251; 330/251; 330/269; 330/300
[58] Field of Search ................... 330/264, 269, 207 A, 330/300, 251; 307/251, 205

[56] References Cited

U.S. PATENT DOCUMENTS 4,028,633  6/1977  Rogers et al. ............... 330/207 A X

*Primary Examiner*—James B. Mullins
*Attorney, Agent, or Firm*—Lewis H. Eslinger; Alvin Sinderbrand

[57] ABSTRACT

A pulse amplifier formed of first and second field effect transistors, each exhibiting an inherent input capacitance at its gate electrode, the field effect transistors being connected in push-pull relation whereby their drain or source electrodes are connected to a common output terminal. First and second resistive circuits are connected in a pulse supply circuit to supply pulse signals to the respective gate electrodes of the field effect transistors. Each of the resistive circuits exhibits a higher resistance when a pulse is supplied therethrough to turn the respective field effect transistor ON and a lower resistance when the pulse is terminated to turn the respective field effect transistor OFF. The higher resistance of the resistive circuit cooperates with the inherent input capacitance of the respective field effect transistor to provide a higher discharge time constant to turn that field effect transistor ON and the lower resistance cooperates with the inherent input capacitance of the field effect transistor to provide a lower charge time constant to turn that field effect transistor OFF, whereby the field effect transistors are not ON concurrently. In a preferred embodiment, the field effect transistors are complementary field effect transistors so that a positive-going pulse turns one of those field effect transistors OFF while turning the other ON, and a negative-going pulse turns the one field effect transistor ON while turning the other OFF.

9 Claims, 6 Drawing Figures

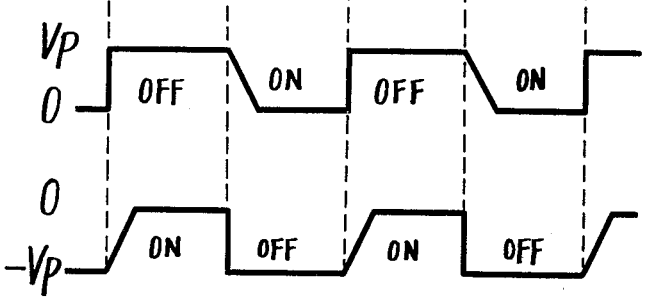
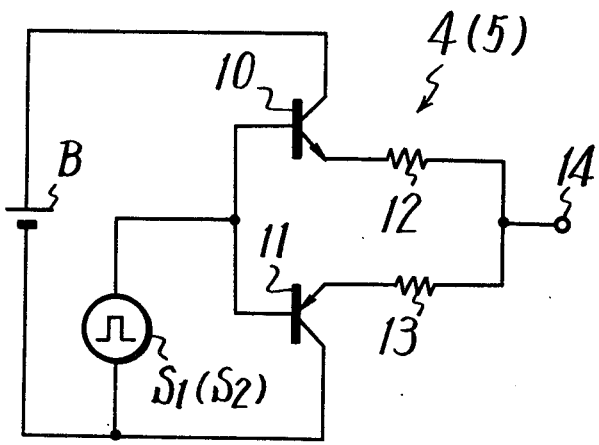

PUSH-PULL PULSE AMPLIFIER HAVING IMPROVED TURN-ON AND TURN-OFF TIMES

BACKGROUND OF THE INVENTION

This invention relates to a pulse amplifier circuit and, more particularly, to a push-pull pulse amplifier using field effect transistors and wherein a power loss to the load caused by simultaneous conduction of the field effect transistors is substantially eliminated.

Push-pull amplifier configurations are advantageous in that higher power levels can be obtained therefrom with minimal distortion. Hence, push-pull power amplifiers find ready application in audio equipment. In one type of push-pull amplifier, field effect transistors (hereinafter FET's) are used as the amplifying elements because FET's generally exhibit switching characteristics which are improved over bipolar transistors. However, inter-electrode capacitance, particularly gate-source capacitance and gate-drain capacitance, of an FET may, in many instances, be detrimental to the overall operation of the FET push-pull amplifier.

The aforementioned inter-electrode capacitance is particularly noticeable when pulse signals are supplied to the gate electrode of the FET, and such capacitance may be considered to be the inherent input capacitance of the FET which is present at its gate electrode. This input gate capacitance cooperates with the resistance of the drive circuit which is coupled to the gate electrode of the FET so as to form an RC delay circuit. This means that the amplified pulse signal produced by the FET exhibits sloping or rounded flanks. That is, the time constant of the RC delay circuit imparts a significant delay to the pulse signal which is supplied to the FET gate electrode, thereby delaying the positive and negative transitions (i.e. the rise time and fall time) of the amplified pulse. This distortion is undesirable and can result in a deteriorated or degraded output.

When a depletion-type FET, such as a junction FET, and particularly a vertical channel junction FET, is used in a switching mode in the aforementioned push-pull pulse amplifier, this FET is more highly conductive when its gate-source voltage $V_{GS}$ is zero. With this zero gate-source voltage, the FET may be considered to be ON, and its drain-source voltage $V_{DS}$ is substantially zero. The FET is rendered non-conductive, that is, it is turned OFF, when its gate-source voltage increases to the FET pinch-off voltage. When the FET is OFF, its drain-source voltage is a maximum value, and if the FET is connected such that its drain-source circuit is connected in series with a DC supply voltage, this drain-source voltage will be substantially equal to that DC supply voltage. Because of the aforementioned RC time constant attributed to the input capacitance of the FET and the resistance of the drive circuits connected thereto, if the voltage which is applied to the gate electrode of the FET changes abruptly from a zero level to the pinch-off level, the FET will not be turned OFF immediately. Rather, a time delay is encountered until the FET is OFF. Similarly, if the voltage which is applied to the gate electrode changes abruptly from the pinch-off level to the zero level, the FET will not be turned ON until after a time delay. Hence, the ideal linear relation between drain-source voltage $V_{DS}$ and gate-source voltage $V_{GS}$ will not be attained. Rather, a change in $V_{GS}$ is delayed with respect to a change in $V_{DS}$, thereby appearing as a non-linear relationship. Consequently, when these FET's are used in a push-pull pulse amplifier, the delay encountered in turning OFF one FET while turning ON the other means that there will be some overlap in time during which both FET's are ON. Hence, a portion of the current which otherwise would flow to the load which is driven by the FET's will be diverted so as to flow through the FET which is in the process of turning OFF. This means that a portion of the input power for driving the load is lost to the FET which should be OFF but, because of its turn-off time delay, is still ON.

The problem of turn-on and turn-off delay also is encountered in bipolar transistors. When a bipolar transistor is in saturation, the minority-carrier density stored in the base region is relatively high. In order for the transistor to be operated in its switching mode, this abnormal carrier density first must be removed before the transistor can be turned OFF. Hence, a relatively long delay may elapse before the bipolar transistor responds to a turn-off signal applied thereto. It has been proposed (Japanese Patent Publication No. 5113/64, published Apr. 21, 1964) to provide a separate minority carrier discharge circuit which is actuated when the bipolar transistor is to be turned OFF. This circuit consists of a diode which is connected to the transistor base electrode and which is poled in a direction such that when the diode is forward biased, the minority carriers may be discharged therethrough. However, this known prior art is not concerned with the problem of overlap in the ON states of transistors which are connected in push-pull relation. Hence, this prior art does not recognize the defect of power loss that may be caused by such ON-state overlap in push-pull transistors. Furthermore, although there is a turn-off delay in bipolar transistors caused by abnormally high minority current densities in the base region when the transistor is in saturation, there is no comparable turn-on delay. This differs from an FET wherein the gate input capacitance thereof causes both a turn-on and a turn-off time delay.

Although the existence of input gate capacitance of an FET has been known, there appears to have been no proposal to utilize this capacitance so as to avoid the problem of power loss mentioned above. Generally, the input gate capacitance of an FET is substantially independent of bias current and, therefore, cannot be easily controlled (i.e., minimized) by judicious selection of the bias current. Nevertheless, it has been known that the time constant of the input gate capacitance and the drive circuit resistance affects the turn-off time of the FET. In the text "FET Applications Handbook" by Eimbinder, Tab Books (1970), it is noted that when a turn-off signal is applied to an FET, an excess charge is provided on the stray capacitance and this charge must be eliminated and the capacitance recharged to supply potential before the FET can be considered OFF. The time required to eliminate the excess charge is the turn-off delay. This text also recognizes that a turn-on delay is caused by the requirement to discharge the gate-source capacitance before the FET can turn ON. However, this text notes that the rise time of the circuit, that is, the turn-on time, is much faster than the fall time, that is, the turn-off time. To account for this turn-off delay, a diode is connected to the gate electrode of the FET and is reverse biased when the FET is to be turned ON, while being forward biased to turn the FET OFF. A capacitor is in parallel with the diode to provide a discharge current path for the input gate capacitance of the FET. Even though these turn-on and turn-off delays are recognized, the problem of power loss is not. In fact, this text states that when two FET's are used to drive a single load in a multiplex type of application, it is advantageous to provide some overlap during which both FET's are ON. Accordingly, the turn-off time should be at least as long as the turn-on delay in order to assure this overlap. See Chapter 17 and particularly Sections 17–3 and 17–9 of this text.

OBJECTS OF THE INVENTION

In view of the aforementioned deficiencies of the prior art, it is an object of the present invention to provide an improved pulse amplifier using FET's which solves the problem of turn-on and turn-off delays attributed to the input gate capacitance of the FET's.

Another object of this invention is to provide a push-pull pulse amplifier using FET's wherein power loss caused by an overlap in the ON times of the FET's is substantially avoided.

A further object of this invention is to provide a pulse amplifier using FET's wherein the drive circuits coupled to the gate electrodes of the FET's, when combined with the input gate capacitance, exhibit different charge and discharge time constants.

An additional object of this invention is to provide a push-pull pulse amplifier using FET's wherein drive circuits are connected to the respective FET's, these drive circuits exhibiting a higher impedance when the FET is turned ON than when the FET is turned OFF, these impedances cooperating with the inherent input gate capacitance of the FET's to provide a higher discharge time constant for turning ON the FET and to provide a lower charge time constant for turning OFF the FET's.

Various other objects, advantages and features of the present invention will become readily apparent from the ensuing detailed description, and the novel features will be particularly pointed out in the appended claims.

SUMMARY OF THE INVENTION

In accordance with this invention, a pulse amplifier is provided with two FET's, each having a gate electrode and source and drain electrodes, and each FET exhibiting an inherent input gate capacitance. The FET's are connected in push-pull relation such that either their drain or source electrodes are connected in common to an output terminal and the other of the drain and source electrodes is adapted to receive a DC energizing voltage. First and second drive circuits are provided to supply pulse signals to the respective gate electrodes of the FET's, each of the drive circuits exhibiting a higher impedance when a pulse is supplied to turn the respective FET ON and a lower impedance when a pulse is terminated to turn the respective FET OFF. The higher impedance cooperates with the input gate capacitance of the respective FET to provide a higher discharge time constant to turn the FET ON and the lower impedance cooperates with the input gate capacitance of the FET to provide a lower charge time constant to turn the FET OFF, whereby the FET's are not ON concurrently.

BRIEF DESCRIPTION OF THE DRAWINGS

The following detailed description, given by way of example, will best be understood in conjunction with the accompanying drawings in which:

FIGS. 3A–3C are waveform diagrams representing signals which are produced at various locations of the circuit shown in FIG. 1; and FIG. 4 is a schematic diagram of another embodiment of the present invention.

DETAILED DESCRIPTION OF SOME OF THE PREFERRED EMBODIMENTS

Figure 1:
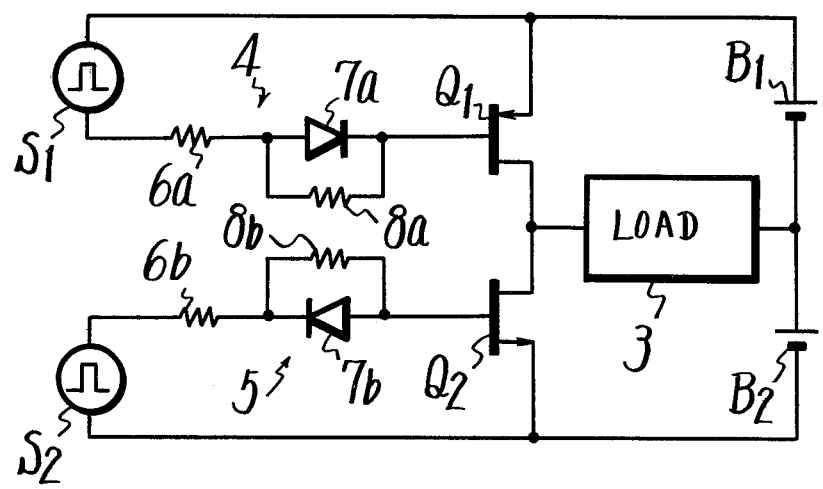
FIG. 1 is a schematic diagram of one embodiment of the present invention.

Referring now to the drawings, and in particular to FIG. 1, there is illustrated one embodiment of a pulse amplifier in accordance with the present invention. The pulse amplifier is formed of FET's $Q_1$ and $Q_2$ which, in the illustrated embodiment, are complementary and are connected in push-pull configuration. Thus, FET $Q_1$ is a p-channel device and FET $Q_2$ is a n-channel device. The drain electrodes of FET's $Q_1$ and $Q_2$ are connected to a common output terminal, and their respective source electrodes are adapted to receive a DC energizing voltage. The gate electrode of each FET is connected to receive a pulse signal, such as a pulse width modulated (PWM) signal, or the like. In general, the pulse signals applied to the gate electrodes of FET's $Q_1$ and $Q_2$ may be characterized as rectangular wave signals, as will be greater described below.

Although a particular push-pull configuration formed of complementary FET's connected as common-source devices is shown, other push-pull circuits may be used, such as a push-pull circuit formed of two n-channel FET's or two p-channel FET's, or a push-pull circuit formed of complementary FET's connected as common-source and common-drain devices, respectively.

The output terminal connected in common to the drain electrodes of FET's $Q_1$ and $Q_2$ in FIG. 1 is adapted to be connected to a load 3. As an example, if the illustrated amplifier circuit is used as an audio power amplifier, the load may be formed of a low-pass filter and a loudspeaker system.

A source of DC energizing voltage $B_1$ is connected to the source electrode of FET $Q_1$ so as to apply a positive DC energizing voltage thereto. Another source of DC energizing voltage $B_2$ is connected to the source electrode of FET $Q_2$ so as to supply a negative DC energizing voltage thereto. Sources $B_1$ and $B_2$ are connected in series, and the junction defined thereby is coupled to load 3, as shown. For example, this junction may provide load 3 with a reference voltage, such as ground. As will be appreciated, depending upon which of FET's $Q_1$ and $Q_2$ is ON, current will flow from source $B_1$, through the source-drain circuit of FET $Q_1$ to load 3; or current will flow from load 3 through the drain-source circuit of FET $Q_2$ to voltage source $B_2$.

Each of FET's $Q_1$ and $Q_2$ is a depletion-type FET, such as a junction FET, and preferably a vertical-channel FET. One example of a vertical channel FET which can be used is described in our U.S. Pat. No. 4,021,748 and exhibits triode-type dynamic characteristics.

Suitable circuitry is provided to supply pulse signals to FET's $Q_1$ and $Q_2$. As an example, this circuitry may include an audio signal preamplifier. In order to simplify the explanation of the illustrated embodiment, the pulse signal supply circuitry is depicted as signal sources $S_1$ and $S_2$ for supplying the positive portion of a pulse signal to FET $Q_1$ and the negative portion of the pulse signal to FET $Q_2$, respectively. Of course, it should be appreciated that conventional pulse signal supply elements, such as an input transformer, a phase splitter, or the like, may be used to supply the pulse signals to these FET's. Hence, if the amplitude of the pulse signal, such as a PWM signal, varies from a positive level to a negative level, pulse source $S_1$ is the equivalent circuit which supplies only that portion of the pulse signal between zero and the positive level, and pulse source $S_2$ is the equivalent circuit which supplies only that portion of the pulse signal from zero to the negative level. Pulse source $S_1$ is connected to the gate-source circuit of FET $Q_1$ by a drive circuit 4, and pulse source $S_2$ is connected to the gate-source circuit of FET $Q_2$ by a drive circuit 5.

Each of drive circuits 4 and 5 is adapted to exhibit a relatively high impedance when a pulse is supplied therethrough to turn the respective FET ON, and to exhibit a relatively low impedance when the supplied pulse terminates to turn the respective FET OFF. In the illustrated embodiment, these impedances are resistive impedances formed of resistors 6a and 8a connected in series in drive circuit 4, and formed of resistors 6b and 8b connected in series in drive circuit 5. One of these resistors in each of the drive circuits is connected in parallel with a diode. Accordingly, in drive circuit 4, a diode 7a is connected in parallel with resistor 8a and is poled in a direction so as to be forward biased when FET $Q_1$ is turned OFF. In drive circuit 5, a diode 7b is connected in parallel with resistor 8b and is poled so as to be forward biased when FET $Q_2$ is turned OFF. The resistance of each of resistors 6a and 6b is represented as Rs. This resistance may be equal to the source impedance of pulse sources $S_1$ and $S_2$, respectively; or may be equal to a discrete resistance plus the source impedance. Resistors 8a and 8b have equal resistance represented as Rg. In the illustrated configuration wherein diodes 7a and 7b are connected in parallel with resistors 8a and 8b, resistance Rg is much greater than resistance Rs (Rg>> Rs).

The effective input gate capacitance of FET's $Q_1$ and $Q_2$ is dependent, to a large extent, upon the gate-source capacitance. If it is assumed that the input gate capacitance is represented as Ci, then during the FET turn-on and turn-off operations, pulse source $S_1$, drive circuit 4 and FET $Q_1$ may be represented as the equivalent circuit of FIG. 2. In this equivalent circuit, capacitor 9a corresponds to the input gate capacitance of FET $Q_1$ and has a capacitance Ci. A similar equivalent circuit, not shown, may be used to represent the turn-on and turn-off modes for FET $Q_2$. Since the operation of FET's $Q_1$ and $Q_2$ is substantially the same, only one need be described.

In operation, let it be assumed that the pulse signal which is supplied to the circuit shown in FIG. 1 is rectangular having a 50% duty cycle as shown by the waveform in FIG. 3A. When this pulse is positive, pulse source $S_1$ supplies a positive-going pulse to FET $Q_1$ whose level increases from zero to the pinch-off voltage $V_p$. At the same time, pulse source $S_2$ supplies a positive-going pulse to FET $Q_2$ whose level decreases from $-V_p$ to zero. Conversely, when the supplied pulse is negative, pulse source $S_1$ supplies a negative-going pulse from level $V_p$ to zero and pulse source $S_2$ supplies a negative-going pulse of increasing magnitude from zero to $-V_p$. Each of the FET's is turned ON when its gate voltage is equal to zero and is turned OFF when its gate voltage is equal to the FET pinch-off voltage. That is, FET $Q_1$ is ON when its gate voltage is zero and is OFF when its gate voltage is $+V_p$. FET $Q_2$ is ON when its gate voltage is zero and is OFF when its gate voltage is $-V_p$.

Initially, let it be assumed that FET $Q_1$ is ON and FET $Q_2$ is OFF. Thus, the gate voltage of FET $Q_1$ is zero and the gate voltage of FET $Q_2$ is $-V_p$. Now, as the pulse produced by pulse source $S_1$ increases from zero to $V_p$, diode 7a is forward biased. This essentially short-circuits resistor 8a, resulting in a relatively low resistive impedance in drive circuit 4. This low resistive impedance, which is substantially equal to resistance Rs of resistor 6a cooperates with capacitance Ci of capacitor 9a (FIG. 2), that is, with the input gate capacitance of FET $Q_1$, to establish a relatively low RC time constant $T_1$. Thus, the input gate capacitance of FET $Q_1$ is rapidly charged because of this low time constant, and FET $Q_1$ is turned OFF rapidly. This is represented by the vertical leading edge of the pulses shown in FIG. 3B. The input gate capacitance of FET $Q_1$ may be thought of as being charged to the pinch-off voltage $V_p$.

Figure 2:
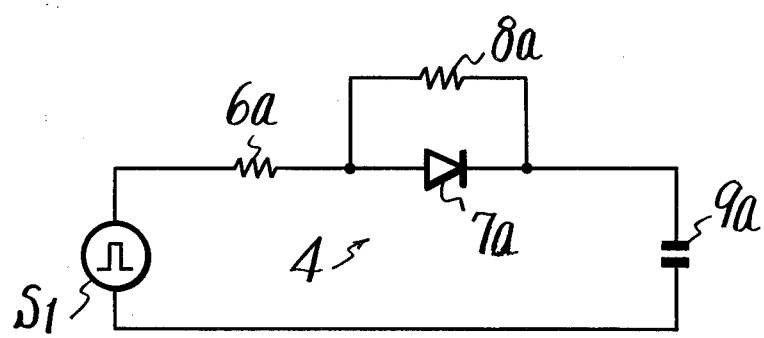
FIG. 2 is a schematic diagram of an equivalent circuit which is useful in understanding the operation of the present invention.

When the pulse supplied by pulse source $S_1$ terminates, FET $Q_1$ is driven to be turned ON. As may be appreciated, diode 7a is reverse biased when the pulse supplied by pulse source $S_1$ terminates because of the pinch-off voltage $V_p$ which is stored on the input gate capacitance of FET $Q_1$ and which is applied to the cathode of this diode. Hence, diode 7a is non-conductive, and a discharge path for the input gate capacitance, that is for capacitor 9a in FIG. 2, is through both resistors 8a and 6a. That is, when the pulse supplied by pulse source $S_1$ terminates, resistor 8a is switched back into drive circuit 4. The resistive impedance of this drive circuit now is much higher than during the FET turn-off mode. Consequently, a relatively high time constant $T_2$ equal to (Rs+Rg)Ci is provided in drive circuit 4. This means that a significant delay must elapse until the input gate capacitance, that is, capacitor 9a, is sufficiently discharged so that the gate voltage of FET $Q_1$ is low enough to turn this transistor ON. The delay in turning ON FET $Q_1$ is represented by the negative slope of the trailing edges of the pulses shown in FIG. 3B.

While FET $Q_1$ turns OFF and ON in the manner shown in FIG. 3B when pulses are supplied as shown in FIG. 3A, FET $Q_2$ operates in a complementary manner. That is, when FET $Q_1$ is turned OFF, FET $Q_2$ is turned ON and, conversely, when FET $Q_1$ is turned ON, FET $Q_2$ is turned OFF. This is shown in FIG. 3C. That is, it is recalled that, initially, it had been assumed that FED $Q_2$ is OFF. This means that the input gate capacitance of FET $Q_2$ is charged to the pinch-off voltage $-V_p$. When pulse source $S_2$ supplies a positive-going pulse to FET $Q_2$, the voltage at the anode of diode 7b is more negative than the voltage which is supplied by pulse source $S_2$. Hence, diode 7b is reverse-biased so as to be non-conductive. Accordingly, drive circuit 5 is formed of resistors 6b and 8b, in series, and the discharge time constant for the input gate capacitance of FET $Q_2$ is equal to (Rs+Rg)Ci. Therefore, a significant discharge delay must elapse until the input gate capacitance of FET $Q_2$ is sufficiently discharged to turn this FET ON. When FET $Q_2$ is to be turned OFF, the voltage applied to the cathode of diode 7b by pulse source $S_2$ is more negative than the discharged voltage across the input gate capacitance of FET $Q_2$. Hence, diode 7b is forward biased so as to be conductive, thereby short-circuiting resistor 8b. This means that the charge time constant for the input gate capacitance of FET $Q_2$ is equal to RsCi, and this charge time constant is substantially less than the aforementioned discharge time constant. Consequently, FET Q₂ is turned OFF more rapidly than it is turned ON.

When the waveforms of FIGS. 3B and 3C are compared, it is appreciated that, because of the longer turn-on time constant for each of the FET's, FET Q₁ will be turned OFF well before FET Q₂ is turned ON, and FET Q₂ is turned OFF well before FET Q₁ is turned ON. Therefore, there is no overlap in the times during which both of these FET's are ON. Since FET's Q₁ and Q₂ are not ON concurrently, current is not diverted from load 3; and there is no power loss.

An alternative embodiment of drive circuits 4 and 5 is illustrated in FIG. 4. This alternative embodiment can be used to replace drive circuit 4, for example, and another similar circuit would be used to replace drive circuit 5. Since drive circuits 4 and 5 are similar in construction and operation, the alternative embodiment shown in FIG. 1 will be assumed to be the replacement for drive circuit 4. In the embodiment of FIG. 1, diode 7a is used as a switch to selectively connect resistor 8a to or from the circuit. In the embodiment of FIG. 4, transistors 10 and 11 are used as switching devices to selectively connect reisistors 12 and 13 to or from the circuit. In particular, transistor 10, which may be a bipolar transistor, has its base electrode connected to pulse source S₁, its collector electrode supplied with a DC energizing voltage B and its emitter electrode connected through resistor 12 to a terminal 14. Terminal 14 is to be connected to the gate electrode of FET Q₁. Transistor 10, which is shown as an NPN transistor, may be considered to be an emitter-follower, and is energized by a relatively positive DC energizing voltage. Transistor 11, which is shown as a PNP transistor, also may be considered to be an emitter-follower having its emitter electrode connected through resistor 13 to terminal 14 and having its collector electrode connected to the negative terminal of voltage supply source B so as to be supplied with a relatively negative DC energizing voltage. The resistance of resistor 12 is equal to Rs and the resistance of resistor 13 is equal to Rs+Rg.

In operation, when pulse source S₁ supplies a positive-going pulse to turn FET Q₁ OFF, this positive pulse turns ON transistor 10 so as to establish a charge path for the input gate capacitance of FET Q₁ through resistor 12. The charge time constant T₁ for the input gate capacitance of FET Q₁ is equal to RsCi. Hence, the input gate capacitance is charged rapidly to the pinch-off voltage $V_p$, thereby rapidly turning OFF FET Q₁.

When the pulse supplied by pulse source S₁ terminates, transistor 10 is turned OFF so as to remove resistor 12 from the charge path to the input gate capacitance of FET Q₁. However, when this pulse terminates, transistor 11 is turned ON so as to connect resistor 13 into the discharge path for the input gate capacitance of FET Q₁. Accordingly, the input gate capacitance discharged through resistor 13, and the time constant for this discharge circuit is equal to (Rs+Rg)Ci. It is appreciated that the charge time constant T₁ and the discharge time constant T₂ for the input gate capacitance of FET Q₁ when the drive circuit shown in FIG. 4 is used are substantially equal to time constants T₁ and T₂ when the drive circuit shown in FIG. 1 is used. Thus, the delay in turning ON FET Q₁ is much greater than the delay in turning this FET OFF. A similar result is achieved if the embodiment shown in FIG. 4 is used as drive circuit 5. Therefore, since FET Q₁ will be turned OFF more rapidly than the turning ON of FET Q₂, and since FET Q₂ will be turned OFF more rapidly than the turning ON of FET Q₁, the problem of power loss is avoided because both transistors will not be ON concurrently.

It should be noted that when the embodiment shown in FIG. 4 is used as drive circuit 5, transistor 10 is turned ON when FET Q₂ is to be turned ON, and transistor 11 is turned ON when FET Q₂ is to be turned OFF. Hence, when the embodiment of FIG. 4 is used as drive circuit 5, the resistance of resistor 12 is equal to Rs+Rg, and the resistance of resistor 13 is equal to Rs so that the larger time constant will be established when FET Q₂ is to be turned ON.

While the present invention has been particularly shown and described with reference to preferred embodiments, it will be readily apparent that various changes and modifications in form and details may be made by one of ordinary skill in the art without departing from the spirit and scope of the invention. For example, resistors 6a and 6b in FIG. 1 may be omitted so as to provide a very short charge time constant for the input gate capacitances of FET's Q₁ and Q₂. As another alternative, other suitable switching devices can be used in place of diodes 7a 7b to selectively switch resistors 8a and 8b into and out of the drive circuits. Similarly, transistors 10 and 11 can be replaced by other equivalent switching elements; and these transistors may be connected in other configurations to couple one or the other of resistors 12 and 13 between pulse source S₁ (or S₂) and the gate electrode of FET Q₁ (or Q₂). It is, therefore, intended that the appended claims be interpreted as including the foregoing as well as various other such changes and modifications.

What is claimed is:

1. A pulse amplifier, comprising first and second field effect transistors, each having an input electrode and a pair of output electrodes and each exhibiting an inherent capacitance at its input electrode, said first and second field effect transistors being connected in push-pull relation such that one of the output electrodes of each of said field effect transistors is connected in common to an output terminal, the other output electrode of each of said field effect transistors is adapted to receive a DC energizing voltage and the input electrode of each of said field effect transistors is adapted to receive a pulse signal; means for supplying pulse signals; and first and second drive circuits connected between said pulse signal supply means and the input electrodes of said first and second field effect transistors respectively, each of said drive circuits exhibiting a higher impedance when a pulse is supplied to turn the respective field effect transistor ON and a lower impedance when a pulse is terminated to turn the respective field effect transistor OFF, said higher impedance cooperating with the inherent capacitance at the input electrode of said respective field effect transistor to provide a higher discharge time constant to turn said field effect transistor ON and said lower impedance cooperating with the inherent capacitance at the input electrode of said respective field effect transistor to provide a lower charge time constant to turn said field effect transistor OFF, whereby said first and second field effect transistors are not ON concurrently.

2. The pulse amplifier of claim 1 wherein each of said drive circuits is comprised of a resistance and switch means selectively operative in response to the pulse signal supplied by said pulse signal supply means to decrease said resistance.

3. The pulse amplifier of claim 2 wherein each of said switch means comprises a diode, each said resistance includes at least two resistors connected in series, and said diode is connected in parallel with at least one of said resistors.

4. The pulse amplifier of claim 1 wherein each of said drive circuits is comprised of two resistances of different resistance values and switch means selectively operative in response to the pulse signal supplied by said pulse signal supply means to couple one or the other of said resistances between said pulse signal supply means and the input electrode of said respective field effect transistor.

5. The pulse amplifier of claim 4 wherein each of said switch means comprises two transistors, one of which being responsive to a pulse signal of predetermined polarity to couple the resistance of higher resistance value between said pulse signal supply means and said input electrode of said respective field effect transistor to turn said field effect transistor ON and the other of said transistors being responsive to the termination of said pulse signal to couple the resistance of lower resistance value between said pulse signal supply means and said input electrode of said respective field effect transistor to turn said field effect transistor OFF.

6. The pulse amplifier of claim 5 wherein said two transistors care complementary transistors, each being connected between said pulse signal supply means and a respective resistor in emitter-follower configuration.

7. The pulse amplifier of claim 1 wherein said field effect transistors are complementary field effect transistors having their drain electrodes connected in common to said output terminal, their source electrodes adapted to receive different DC energizing voltages and their gate electrodes connected to said first and second drive circuits, respectively.

8. The pulse amplifier of claim 7 wherein said complementary field effect transistors are vertical channel field effect transistors.

9. The pulse amplifier of claim 7 wherein said pulse supply means supplies rectangular pulse-wave signals to said complementary field effect transistors to turn one of said field effect transistors OFF and the other of said field effect transistors ON in response to a positive-going pulse signal and to turn said one field effect transistor ON and said other field effect transistor OFF in response to a negative-going pulse signal.

* * * * *